United States Patent [19]

Runge

[11] 4,170,018

[45] Oct. 2, 1979

[54] LIGHT EMITTING SEMICONDUCTOR COMPONENT

[75] Inventor: Hartmut Runge, Kirchseeon, Fed. Rep. of Germany

[73] Assignee: Siemens Aktiengesellschaft, Berlin & Munich, Fed. Rep. of Germany

[21] Appl. No.: 891,559

[22] Filed: Mar. 30, 1978

[30] Foreign Application Priority Data

Apr. 12, 1977 [DE] Fed. Rep. of Germany ....... 2716143

[51] Int. Cl.$^2$ ............................................. H01L 33/00
[52] U.S. Cl. ....................................... 357/17; 313/498; 313/499; 313/499
[58] Field of Search ...................... 313/498; 357/17, 18

[56] References Cited

U.S. PATENT DOCUMENTS 4,062,035  12/1977  Winstel .................................. 357/17

OTHER PUBLICATIONS

Hurd et al., *J. Vac. Sci. Technol.*, vol. 13, No. 1, Jan.-/Feb. 1976, pp. 410-413.

*Primary Examiner*—Martin H. Edlow
*Attorney, Agent, or Firm*—Hill, Van Santen, Steadman, Chiara & Simpson

[57] ABSTRACT

A light emitting semiconductor component in which a semiconductor substrate of a first conductivity type has a zone of a second conductivity type formed therein immediately below a portion of a planar surface thereof. An insulating layer covers the planar surface but has a window through the insulating layer above most of the zone of the second conductivity type. A layer of $Zn_2SiO_4$ doped with a luminous phosphor lies on the planar substrate surface within this window without contact with the walls of the window opening. Three metal electrodes are formed, one on the portion of the $Zn_2SiO_4$ layer, one on the substrate surface above a marginal portion of the doped zone, and one on the substrate spaced from the doped zone.

The $Zn_2O_4$ layer is preferably doped with Mn ions in a concentration of between $5 \cdot 10^{16}$ and $5 \cdot 10^{19}$ cm$^{-3}$. The depth of the zone is less than 1000 nm. One preferred doping for the zone of the second conductivity type is a doping of boron in a concentration of between $5 \cdot 10^{18}$ and $5 \cdot 10^{19}$ ions cm$^{-3}$. A process for the production of the component is disclosed, and a process for the operation of the component is disclosed.

3 Claims, 7 Drawing Figures

LIGHT EMITTING SEMICONDUCTOR COMPONENT

BACKGROUND OF THE INVENTION

The invention relates to a light emitting semiconductor component which can be produced as a silicon semiconductor substrate as part of an integrated circuit.

In modern semiconductor technology, the requirement very often exists of rendering the results of electrical measurements or operations optically visible, e.g., in pocket calculators, wristwatches and in measuring instruments having a digital display. Those components which serve to carry out electrical operations or the processing of measured values currently consist virtually entirely of silicon semiconductor components. As silicon is not light-emissive in the visible spectral range, special components or component groups are employed for the optical displays which are galvanically connected via supply lines to the silicon semiconductor components.

PRIOR ART

In accordance with the prior art, generally light emitting diodes, e.g., GaP luminescent diodes or liquid crystals are generally used for the optical display.

The optical display elements employed in the prior art have the disadvantage that they must be constructed separately from the silicon semiconductor components and the integrated circuits produced on a silicon chip so that they cannot be constructed in integrated fashion together with the silicon components and thus cannot be produced in the same process.

The aim of the invention is to provide a light emitting semiconductor component which can be produced on a silicon semiconductor substrate and, for the production process, can be combined with the other process steps required for constructing integrated circuits on silicon.

Preferred embodiments of the semiconductor component of the invention and a process for the production thereof and an operating process for this component are hereafter described.

The invention exploits the fact, known from "Journal Vacuum Science and Technology", Vol. 13, No. 1, 1976, pages 410–413 that thin films consisting of $Zn_2SiO_4$ can be doped by ion implantation with ions of a luminous phosphors, for example, $Mn^+$-ions, and that when bombarded with an electron beam, layers of this kind can be excited so as to become luminescent.

SUMMARY OF THE INVENTION

In accordance with the present invention, a silicon substrate is coated with a layer of $Zn_2SiO_4$ and beneath this layer, doped with a luminous phosphors in the silicon substrate, there is arranged a pn-junction. If the pn-junction is operated in the flow direction and an appropriate potential is connected to the layer doped with the luminous phosphors, electrons pass out of the silicon substrate into this layer provided with the luminous phosphors where they produce light emission. The advantage of the component in accordance with the invention consists in that it can be constructed on a silicon substrate and that the production process thereof is compatible with conventional silicon technology.

In the following, the semiconductor component in accordance with the invention will be described in detail making reference to an exemplary embodiment illustrated in the Figures, and a production process and operating process for this component will be described.

DESCRIPTION OF THE PREFERRED EMBODIMENT

Figure 1:
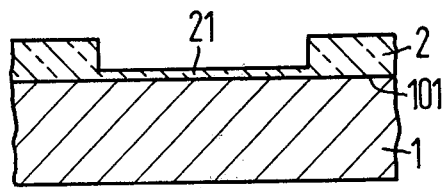
FIGS. 1 to 5 schematically illustrate the production process for a light emitting semiconductor component in accordance with the invention, FIG. 6 schematically illustrates the finished, light emitting semiconductor component, and FIG. 7 schematically illustrates the matter in which the light emitting semiconductor component in accordance with the invention is operated.
Figure 2:
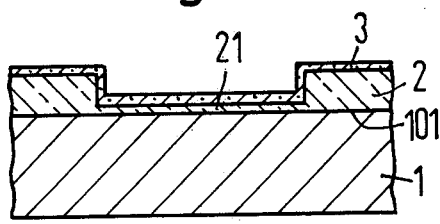
Figure 3:
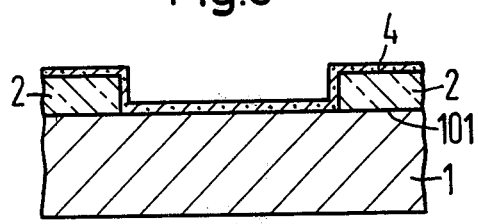
Figure 4:
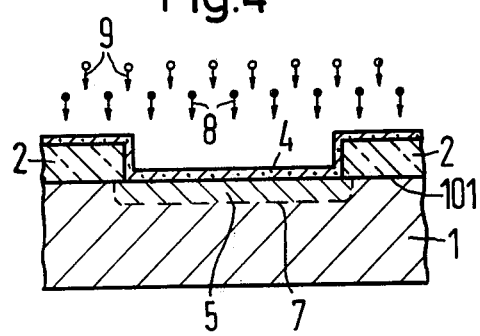
Figure 5:
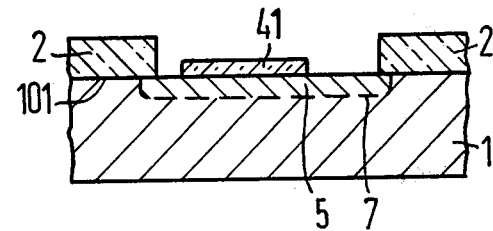
Figure 6:
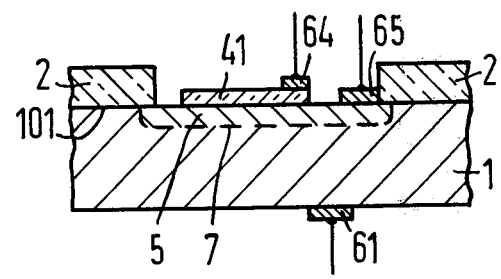

A preferred embodiment of the present invention includes a silicon substrate 1 of a first conductivity type such, for example, as an n-conducting silicon having a specific resistance of, e.g., 0.1 ohm-cm. The semiconductor component is produced by forming a thick oxide layer 2 on the substrate by thermal oxidation in a thickness of approximately 1 μm. By employing a photolithographic technique, a window is etched into this thick oxide layer 2 above the area provided for a zone 5 of the second conductivity type, so that the substrate 1 is exposed at this point. The substrate surface which has been exposed in this way is then coated with a thin oxide layer 21 consisting os $SiO_2$, for example, by heating in the presence of oxygen. The thickness of this thin oxide layer 21 is approximately 200 nm. Thereafter, a further layer 3 consisting of $ZnF_2$ is deposited in a thickness of approximately 150 nm, and possibly also over the thick oxide layer 2. The deposition of the $ZnF_2$ can also take place by vapor deposition.

Following the application of this $ZnF_2$ layer, the substrate and the layer arranged thereupon are tempered for several hours at approximately 1000° C. A reaction of the type $2ZnF_2 + 2SiO_2 \rightarrow Zn_2SiO_4 + SiF_4$ now takes place, by means of which the thin oxide layer 21 and parts of the thick oxide layer 2 are transformed into a $Zn_2SiO_4$ layer 4. As a result of this transformation, a fault-free transition between the Si substrate and the $Zn_2SiO_4$ layer is achieved. When the $Zn_2SiO_4$ layer 4 has been produced, ions of the p-conductivity type, for example B-ions are implanted in order to produce a flat zone 5 of the second conductivity type. The implantation energy and the dose are contrived to be such that between the substrate 1 and this zone 5, there runs a pn-boundary layer 7 at a depth of approximately mately 100 nm beneath the substrate surface. This first implantation step is followed by a second implantation step employing ions 9 of a luminous phosphors, for example Mn ions. The sequence of the implantation steps can also be reversed.

Following this second implantation, tempering is carried out at approximately 1100° for approximately 15 minutes in order to heal and activate implanted B- and Mn-doping. Employing a photolithographic technique, the $Zn_2SiO_4$ layer 4 is then etched away, with the exclusion of the zones 41 provided for the luminescent zones. Ascetic acid can be employed for example, as etching agent. Following the formation of the zones 41, the electrodes are produced by vapor deposition with aluminum. Then the individual contact electrodes 64 and 65 are etched out of this aluminum layer again employing a photolithographic technique. A substrate terminal 61 is also provided, for example, on the rear of the substrate 1. The aluminum contacts are alloyed in by heating the component to approximately 450° C. for 15 minutes in a H$_2$ atmosphere.

Figure 7:
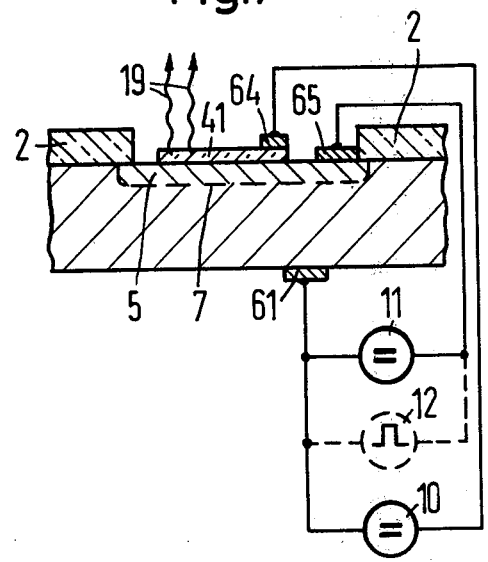

FIG. 7 schematically illustrates the operating process for a light emitting semiconductor component in accordance with the invention. Between the substrate contact 61 and the electrode 64 arranged on the Zn$_2$SiO$_4$ layer 41, there is connected a voltage source 10, so that the potential across the electrode 64 amounts to approximately 50 V relative to the substrate. Between the electrode 65 of the zone 5 and the substrate terminal, there is connected a voltage source 11, so that a potential difference of more than approximately 0.7 V exists between this electrode 65 and the substrate. The magnitude of the voltage source 11 can serve to control the current injected into the layer 41. In place of the d.c. voltage source 11, a pulse generator 12 can also be connected between the electrode 65 and the substrate, so that the potential of the zone 5 is increased in pulse like fashion above the substrate. When the component is operated in this way, electrons pass from the substrate via the zone 5 into the layer 41 where they lead to light emission from light quanta on the ions of the luminous phosphors.

It will be apparent to those skilled in the art that many modifications and variations may be effected without departing from the spirit and scope of the novel concepts of the present invention.

I claim as my invention:

1. A light emitting semiconductor compound comprising a semiconductor substrate of a first conductivity type, said substrate having a zone of the second conductivity type lying immediately below a planar surface of said substrate and forming a pn-junction therewith lying substantially parallel to said planar surface, a layer of Zn$_2$SiO$_4$ on said planar surface of said substrate above a portion of said zone, said layer of Zn$_2$SiO$_4$ being doped with a luminous phosphor, said Zn$_2$SiO$_4$ layer, said zone, and said substrate each being provided with a terminal electrode.

2. Light emitting semiconductor component as claimed in claim 1, in which said Zn$_2$SiO$_4$ layer is doped with Mn ions and in a concentration of between $5 \cdot 10^{16}$ and $5 \cdot 10^{19}$ cm$^{-3}$.

3. Light emitting semiconductor component as claimed in one of the claims 1 or 2, in which said pn-junction lying at a distance of less than 1000 nm beneath the substrate surface.

* * * * *